(12) United States Patent
Beckmann et al.

(10) Patent No.: US 6,528,384 B2
(45) Date of Patent: Mar. 4, 2003

(54) METHOD FOR MANUFACTURING A TRENCH CAPACITOR

(75) Inventors: Gustav Beckmann, Radeburg (DE); Moritz Haupt, Ottendorf-Okrilla (DE); Anke Krasemann, Dresden (DE); Alexandra Lamprecht, Dresden (DE); Dietmar Ottenwälder, Dresden (DE); Jens-Uwe Sachse, Dresden (DE); Martin Schrems, Langebrück (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/811,800

(22) Filed: Mar. 19, 2001

(65) Prior Publication Data

US 2001/0055846 A1 Dec. 27, 2001

(30) Foreign Application Priority Data

Mar. 17, 2000 (DE) .......................................... 100 14 920

(51) Int. Cl.⁷ ............................................. H01L 21/20
(52) U.S. Cl. ....................... 438/386; 438/392; 438/243; 438/249
(58) Field of Search ................................. 438/243–249, 438/386–392

(56) References Cited

U.S. PATENT DOCUMENTS

| | | | |
|---|---|---|---|
| 5,945,704 A | | 8/1999 | Schrems et al. |
| 6,100,132 A | * | 8/2000 | Sato et al. .................. 438/243 |
| 6,159,874 A | * | 12/2000 | Tews et al. .................. 438/964 |
| 6,207,494 B1 | * | 3/2001 | Graimann et al. .......... 438/248 |
| 6,232,171 B1 | * | 5/2001 | Mei ........................... 438/246 |
| 6,245,612 B1 | * | 6/2001 | Chang et al. ................ 438/249 |
| 6,319,788 B1 | * | 11/2001 | Gruening et al. ........... 438/386 |

* cited by examiner

Primary Examiner—Matthew Smith
Assistant Examiner—Renzo N. Rocchegiani
(74) Attorney, Agent, or Firm—Laurence A. Greenberg; Werner H. Stemer; Ralph E. Locher

(57) ABSTRACT

A method for manufacturing a trench capacitor uses a low-pressure gas phase doping for forming a buried plate as a capacitor plate. The use of the low-pressure gas phase doping reduces process costs and improves capacitor properties.

14 Claims, 8 Drawing Sheets

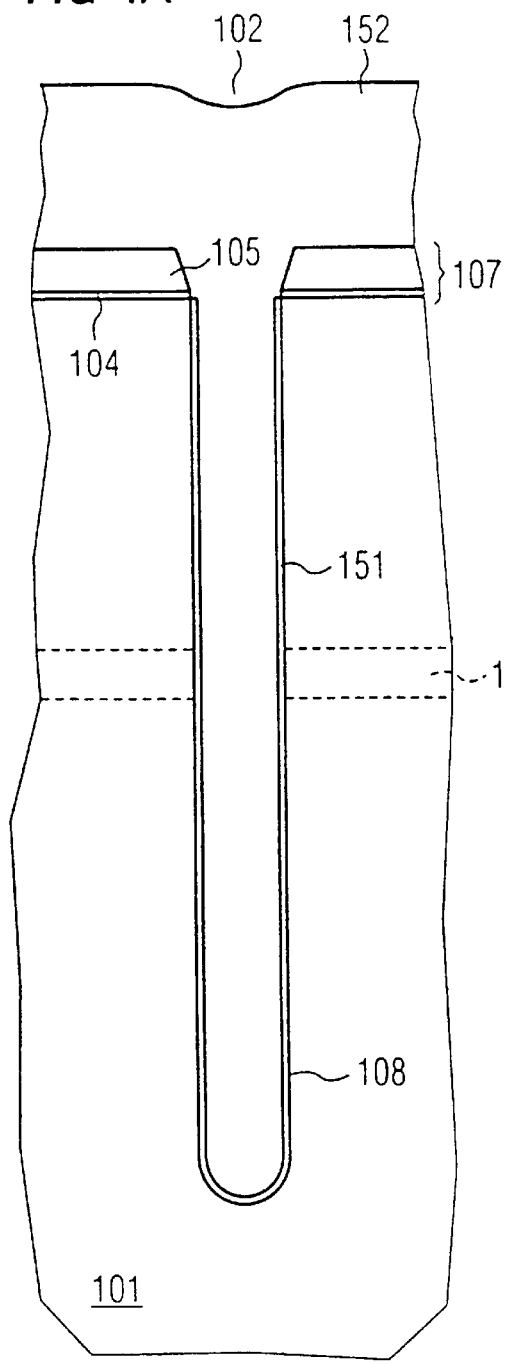
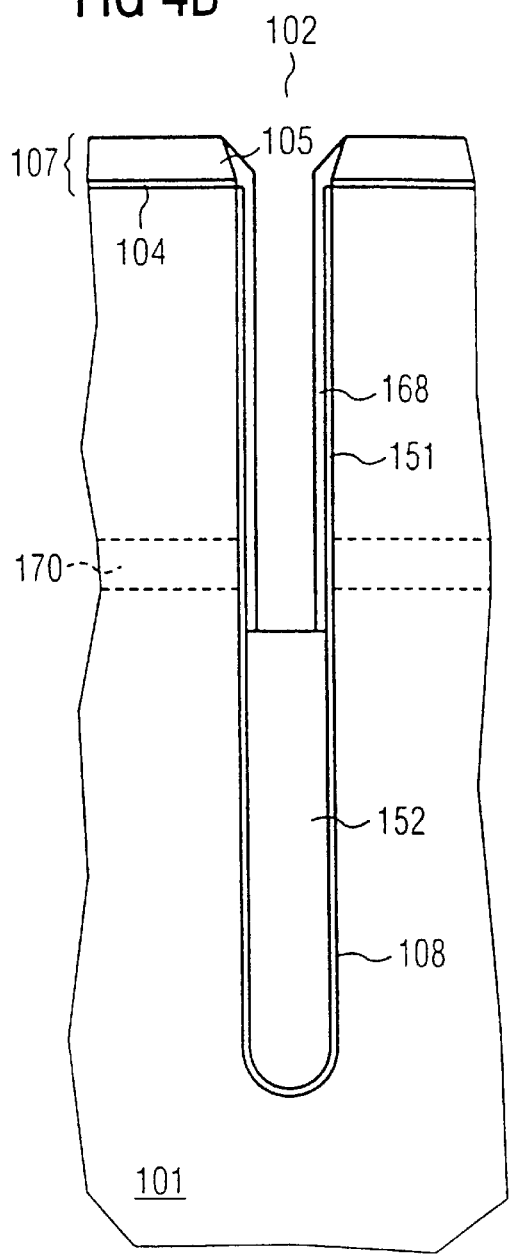

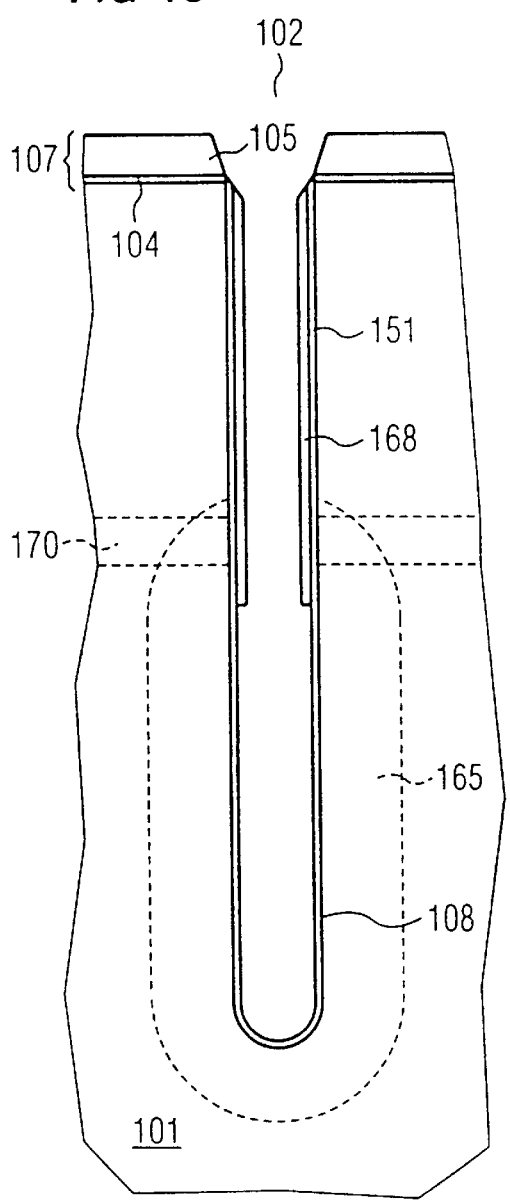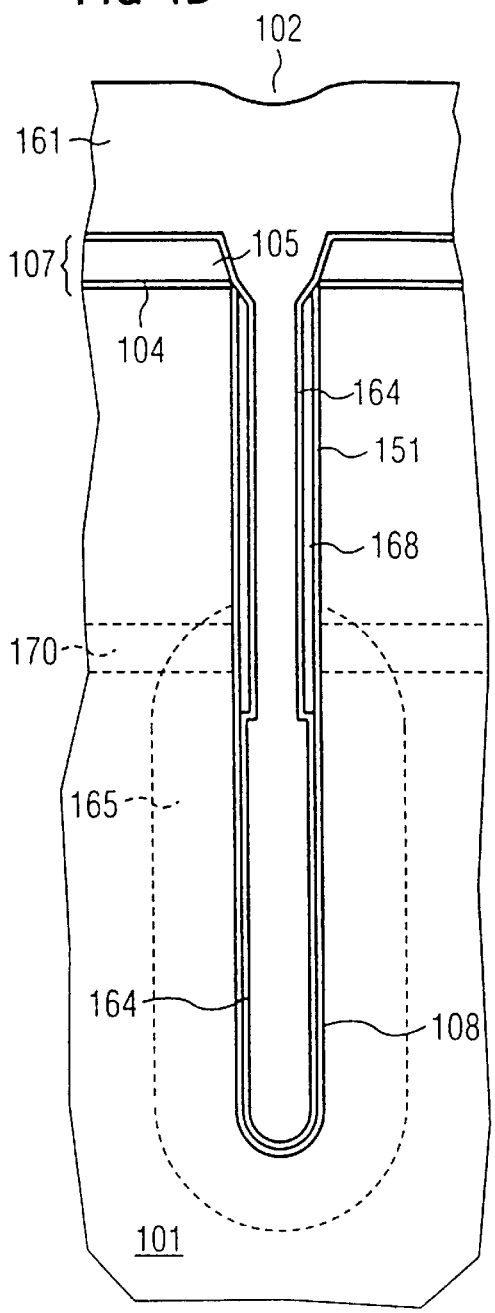

METHOD FOR MANUFACTURING A TRENCH CAPACITOR

BACKGROUND OF THE INVENTION

Field of the Invention

The invention relates to a method for manufacturing a trench capacitor, and in particular to a method for manufacturing a trench capacitor in a semiconductor memory cell of an integrated circuit.

Integrated circuits having such a semiconductor memory cell are, for example, random access memories (RAM, random access memory), dynamic memories (DRAM, dynamic random access memory), synchronous dynamic memories (SDRAM, synchronous DRAM), static memories (SRAM, static random access memory), read-only memories (ROM) or other memory circuits such as programmable logic fields (PLA, programmable logic array), user-specific integrated circuits (ASIC, application-specific IC) and the like.

In order to explain the invention, a conventional method for manufacturing a trench capacitor in a dynamic semiconductor memory cell of a dynamic memory DRAM will be described below.

FIG. 1 shows a conventional trench capacitor such as is used in particular in a DRAM semiconductor memory cell, and is described, for example, in U.S. Pat. No. 5,945,704. Such a DRAM semiconductor memory cell is formed essentially of a capacitor 160, which is formed in a substrate 101. The substrate 101 is slightly doped with, for example, p-type dopants such as boron (B). A trench is usually filled with polysilicon 161, which is highly n⁺-type doped with, for example, arsenic (As) or phosphorus (P). A buried plate 165 which is doped with, for example, arsenic (As) is located in the substrate 101 at a lower region of the trench. The arsenic (As) or, generally speaking, the dopant is usually diffused into the silicon substrate 101 from a dopant source such as an arsenic silicate glass ASG which is formed on the side walls of the trench. The polysilicon 161 and the buried plate 165 serve here as electrodes of the capacitor, a dielectric layer 165 separating the electrodes of the capacitor.

The DRAM semiconductor memory cell according to FIG. 1 also has a field-effect transistor 110. The transistor has a gate 112 and diffusion zones 113 and 114. The diffusion zones, which are spaced apart from one another by a channel 117, are usually formed by the implantation of dopants such as phosphorus (P). A contact diffusion zone 125 connects the capacitor 160 to the transistor 110 here.

An insulating collar 168 is formed on an upper section or upper region of the trench. The insulating collar 168 prevents a leakage current from the contact diffusion zone 125 to the buried plate 165. Such a leakage current is undesirable, in particular in memory circuits, because it reduces the charge holding time or retention time of a semiconductor memory cell.

According to FIG. 1, the conventional semiconductor memory cell with trench capacitor also has a buried well or layer 170, the peak concentration of the dopants in the buried n-type well being located approximately at the lower end of the insulating collar 168. The buried well or layer 170 serves essentially to connect the buried plates 165 of a multiplicity of adjacent DRAM semiconductor memory cells or capacitors 160 in the semiconductor substrate 101.

Activation of the transistor 110 by applying a suitable voltage to the gate 112 permits essentially access to the trench capacitor, the gate 112 being usually connected to a word line 120, and the diffusion zone 113 being usually connected to a bit line 185 in the DRAM field. The bit line 185 is separated from the diffusion zone 113 here through the use of a dielectric insulating layer 189, and electrically connected via a contact 183.

In addition, in order to insulate a respective semiconductor memory cell with an associated trench capacitor from adjacent cells, a shallow trench insulation (STI) 180 is formed on the surface of the semiconductor substrate 101. According to FIG. 1, it is possible to form, for example, the word line 120 above the trench so that it is insulated by the shallow trench insulation (STI), resulting in a so-called folded bit line architecture.

In this way, a semiconductor memory cell is obtained which has a minimum space requirement and is thus very much suited for highly integrated circuits.

According to U.S. Pat. No. 5,945,704, a number of methods is used, in particular for forming the buried plate 165. In addition to ion implantation of arsenic or phosphorus, plasma doping or plasma immersion ion implantation, gas phase doping with AsH₃ or PH₃ is also possible.

However, what is disadvantageous, in particular with conventional gas phase doping, which is usually carried out at a pressure of several 100 Torr (13.3 kPascal), is that the silicon begins to flow, as a result of which the silicon patterns are deformed, and moreover the insulating collar does not constitute a sufficient barrier for the diffusion with respect to the dopants. On the other hand, the use of ion implantation, plasma doping, plasma immersion ion implantation or a doping source in the trench significantly complicates the manufacturing process, as a result of which the manufacturing costs are increased and the yield is reduced.

SUMMARY OF THE INVENTION

It is accordingly an object of the invention to provide a method for manufacturing a trench capacitor which overcomes the above-mentioned disadvantages of the heretofore-known methods of this general type and which allows to produce the trench capacitors and the respective devices having such trench capacitors with a high yield and in a particularly simple and cost-effective way.

With the foregoing and other objects in view there is provided, in accordance with the invention, a method for manufacturing a trench capacitor, the method includes the steps of:

(a) providing a substrate;
(b) forming a trench with a lower region and an upper region in the substrate;
(c) filling the lower region of the trench with a first filler material;
(d) forming an insulation collar in the upper region of the trench;
(e) removing the first filler material from the lower region of the trench;
(f) forming a buried plate as a first capacitor plate in the substrate such that the buried plate is disposed adjacent to the lower region of the trench and using a low-pressure gas phase doping for forming the buried plate;
(g) forming a dielectric layer as a capacitor dielectric lining the lower region of the trench and an inner side of the insulation collar; and
(h) filling the trench with a conductive second filler material as a second capacitor plate.

The method according to the invention can reliably prevent a diffusion of dopants (for example arsenic or phosphorus) through the insulating collar, in particular in comparison with conventional gas phase doping methods, by, in particular, forming the buried plate with a low-pressure gas phase doping, as a result of which a leakage current is greatly reduced and, respectively, a charge holding time (retention time) is significantly improved. The term low-pressure gas phase doping is to be understood as a gas phase doping at a pressure of less than several hundred Torr as is used in the prior art. At the same time, significantly higher dopant concentrations are obtained in the lower region of the trench, as a result of which the capacitance of the capacitor can be significantly improved due to a reduced space charge region (depletion region). As a result, a trench capacitor with a sufficient capacitance is obtained which is in particular suitable for further technology "shrinks."

The buried plate is preferably formed at a pressure of 66 Pascal to 200 Pascal (0.5 to 1.5 Torr) and at a temperature of 750° C. to 1050° C. using $AsH_3$ or $PH_3$ in a carrier gas composed of $H_2$ or He. A further cost saving is obtained by virtue of the simplification of the process in particular in comparison with an ASG deposition process for forming the buried plate with a subsequent high temperature step for diffusing out the dopants. Moreover, the potential risk with such a low pressure and temperature is reduced significantly in comparison with conventional gas phase doping.

In addition, the formation of the dielectric layer takes place essentially at the same temperature and at the same pressure as the formation of the buried plate. The dielectric layer can be formed here by prenitridization and main nitridization, wherein it is possible to integrate the steps for the nitridization or formation of the dielectric layer and for the formation of the buried plate within one process step, and in addition the use of one piece of equipment, or the same system, resulting in a further considerable saving in process costs. In addition, commercially available high-temperature reactors can also be used without additional specific modification for the manufacturing method. Furthermore, an essential reduction in process costs is obtained from the considerable savings in dopants such as $AsH_3$ or $PH_3$.

According to another mode of the invention, the dielectric layer and the buried plate are formed at substantially identical pressures and substantially identical temperatures.

According to yet another mode of the invention, the dielectric layer and the buried plate are formed at a pressure below 200 Pascal, in particular between 66 Pascal and 200 Pascal (0.5 to 1.5 Torr) and a temperature between 750° C. and 1050° C.

According to a further mode of the invention, the dielectric layer is formed by using a prenitridization step and a main nitridization step.

According to another mode of the invention, the prenitridization step is carried out at a temperature of substantially 950° C. and a pressure of substantially 800 Pascal (6 Torr) and by using $NH_3$ for the prenitridization step.

According to yet another mode of the invention, the main nitridization step is carried out at a temperature of between approximately 700° C. and approximately 800° C. and a pressure between 26.6 Pascal and 46.7 Pascal (200 to 350 mTorr) and by using $NH_3$ together with $SiCl_2H_2$ or $SiH_4$ for the main nitridization step.

According to a further mode of the invention, the buried plate is formed in a self-aligned manner with respect to the insulating collar.

According to another mode of the invention, a third, conductive filler material is used to form a bridge above the insulating collar such that the bridge is disposed on the conductive, second filler material and forms a buried contact to the substrate.

According to yet another mode of the invention, an etch stop layer is formed on walls of the trench such that the etch stop layer is disposed under the first filler material.

Other features which are considered as characteristic for the invention are set forth in the appended claims.

Although the invention is illustrated and described herein as embodied in a method for manufacturing a trench capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4A to 4G are simplified partial sectional views for illustrating respective method steps for forming a trench capacitor according to the first exemplary embodiment.

DESCRIPTION OF THE PREFERRED EMBODIMENTS

Figure 1:
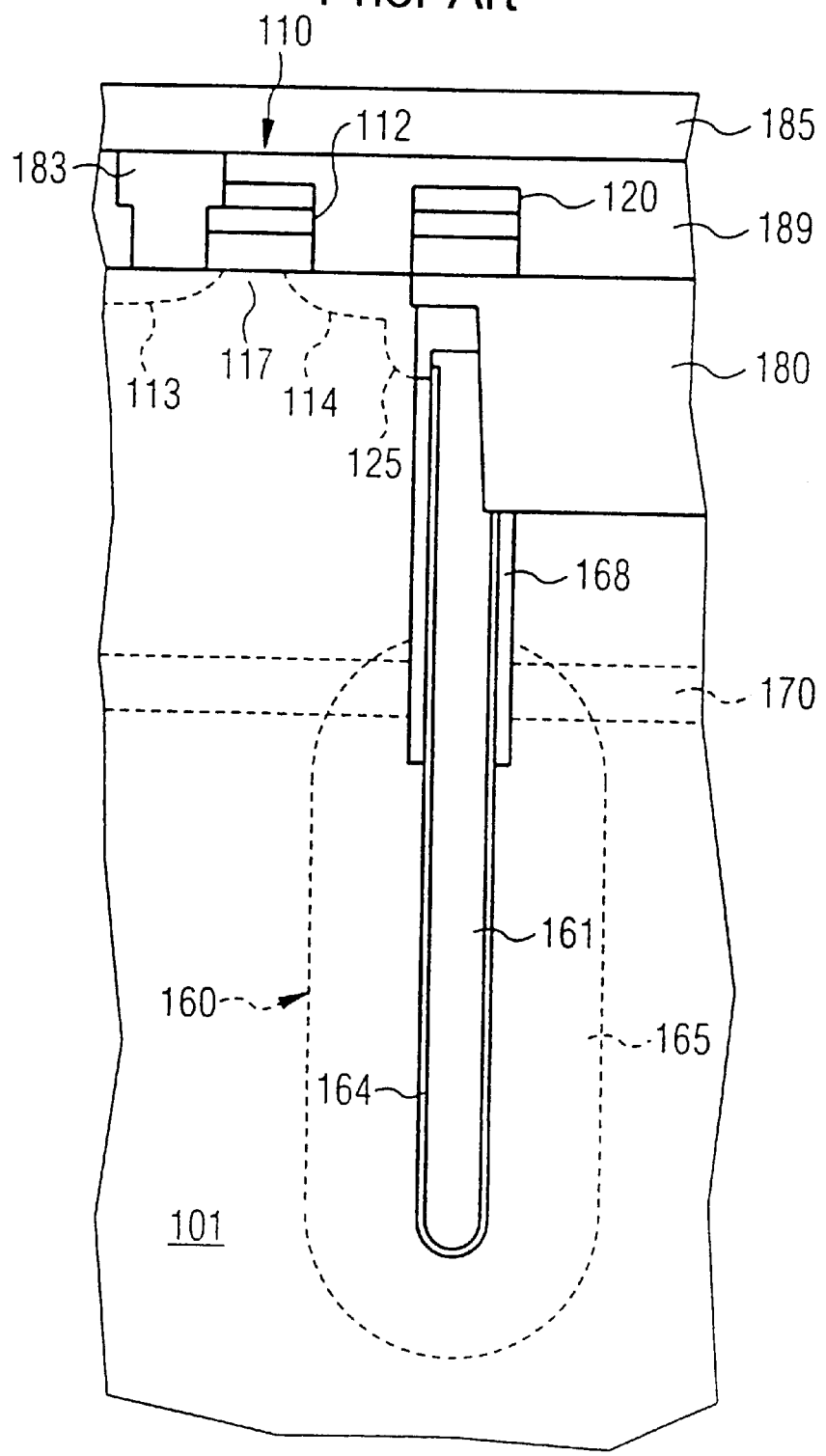
FIG. 1 is a diagrammatic, partial cross-sectional view of a semiconductor memory cell with a trench capacitor according to the prior art.
Figure 2:
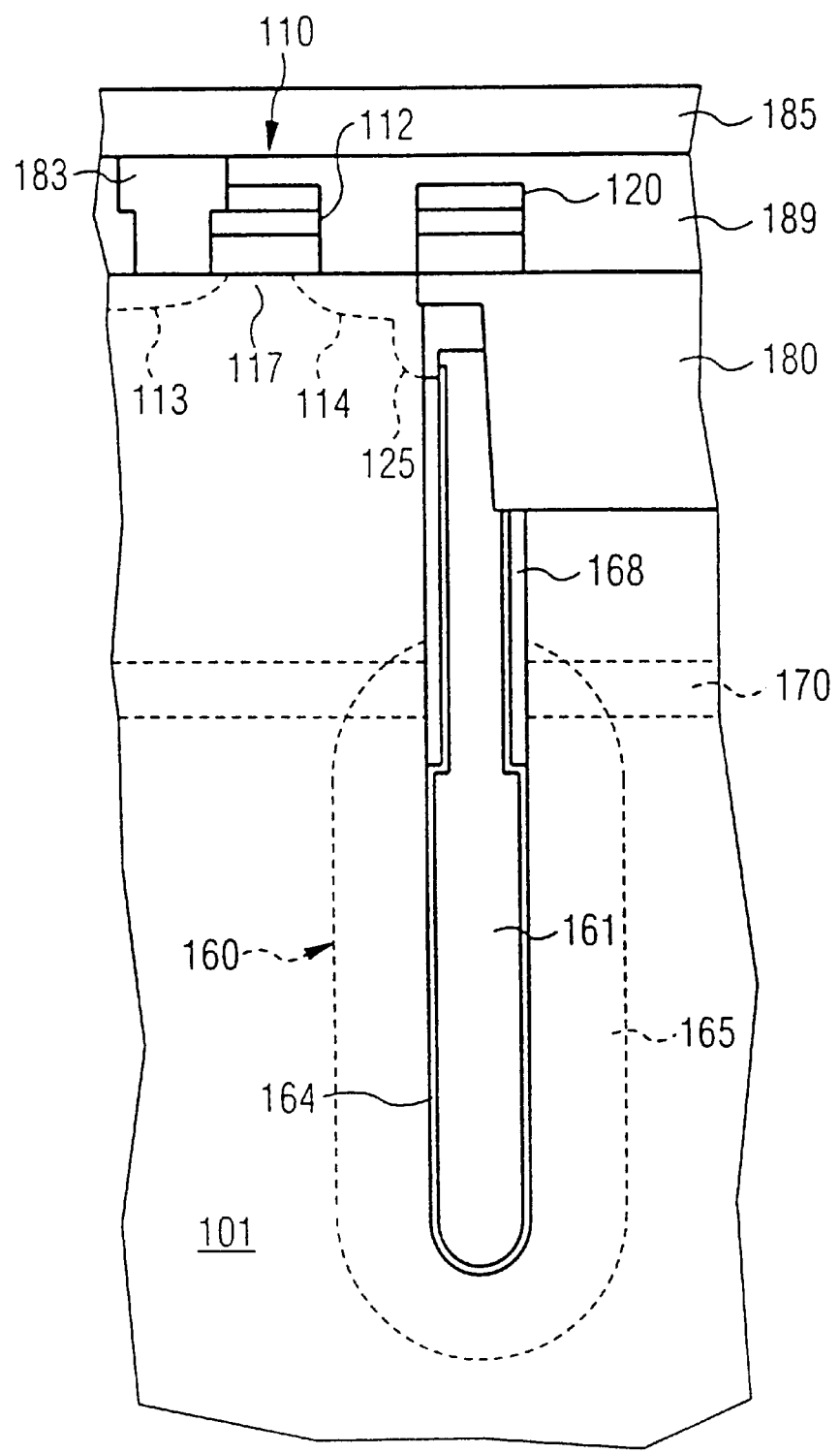
FIG. 2 is a simplified, partial cross-sectional view of a semiconductor memory cell with a trench capacitor according to a first exemplary embodiment according to the invention.
Figure 3:
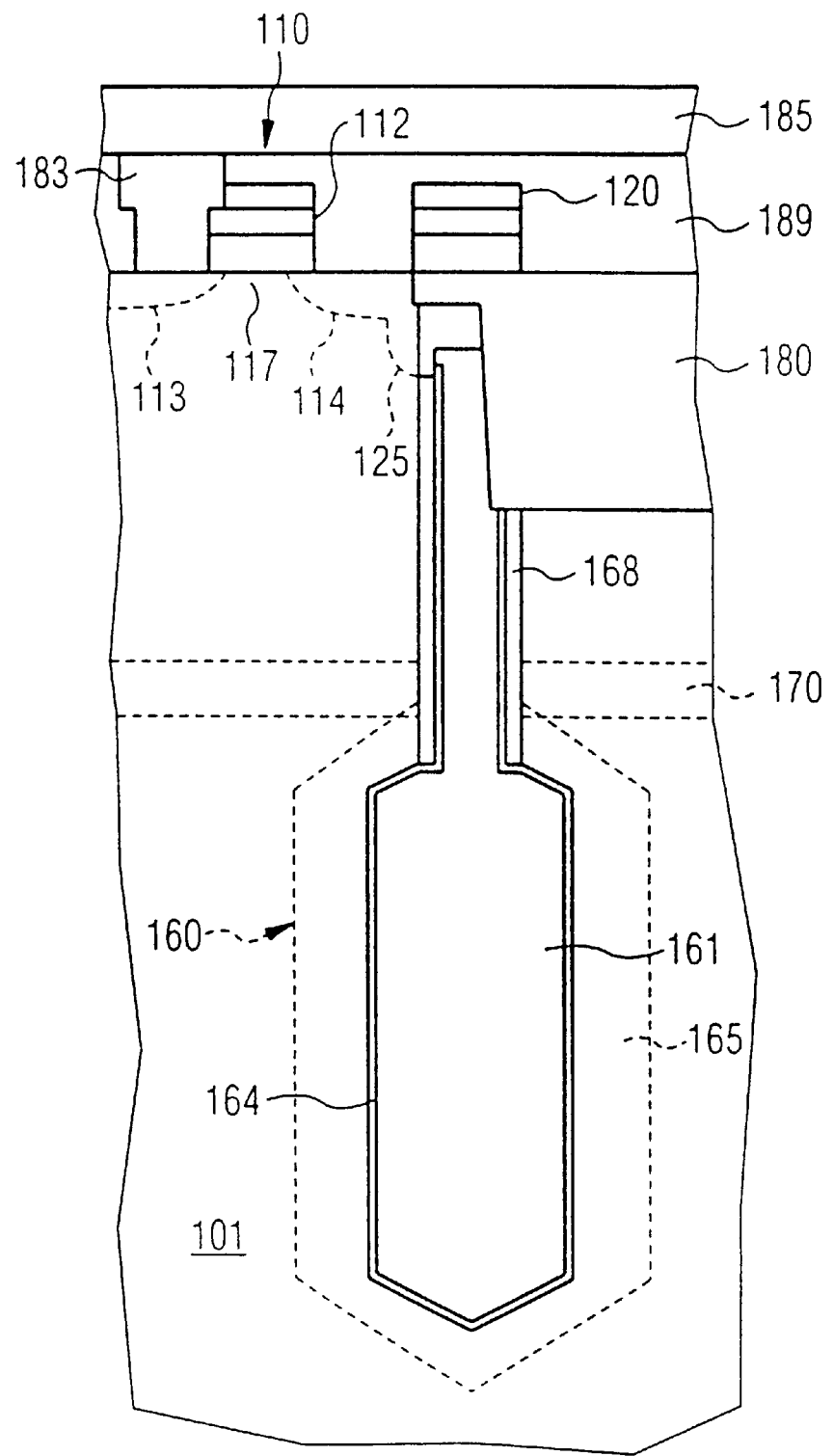
FIG. 3 is a simplified, partial cross-sectional view of a semiconductor memory cell with a trench capacitor according to a second exemplary embodiment according to the invention.

Referring now to the figures of the drawings in detail and first, particularly, to FIGS. 2 and 3 thereof, there is shown a simplified sectional view of a semiconductor memory cell with a trench capacitor according to a first and a second exemplary embodiment. Identical reference symbols are used for representing identical or similar elements or layers, and they are not described in detail below in order to avoid repetitions.

According to FIG. 2, a trench capacitor 160 is composed of a deep trench, which is formed in a semiconductor substrate 101 and has an insulating collar 168 in its upper region. In its lower region or section, the trench has a buried plate 165, which in turn acts as a first capacitor electrode and is separated from a conductive filler material 161, which acts as a second capacitor plate, through the use of a dielectric layer 164. The buried plate 165 is formed here through the use of low-pressure gas phase doping, as a result of which sufficient edge coverage is always obtained and no depletion effects occur in the entire reactor volume.

In the same way, FIG. 3 shows a simplified sectional view of a semiconductor memory cell with a trench capacitor according to a second exemplary embodiment, the lower region of the trench being widened in order to increase the capacitance of the capacitor. In particular, when such a widening of the trench is used, the low-pressure gas phase doping according to the invention allows the buried plate 165 to be formed particularly easily because the dopants always diffuse into the semiconductor substrate 101 to the same extent. There are no problems whatsoever in the edge coverage in particular with such widening of the trench in its lower region, with no depletion effects in the entire reactor volume either. When future technology shrinks occur and there are further reductions in pattern sizes, the method according to the invention for manufacturing a trench capacitor will thus allow a simplified and extremely cost-effective process.

The method for manufacturing the trench capacitor 160 according to FIG. 2 is described below in detail.

FIGS. 4A to 4G show simplified sectional views of respective method steps for manufacturing the semiconductor memory cell according to FIG. 2.

The semiconductor substrate 101 in which the DRAM semiconductor memory cell is formed is firstly prepared in accordance with FIG. 4A. The main surface of the substrate 101 is not critical here and can have any desired suitable orientation, for example (100), (110) or (111). In the first exemplary embodiment here, the substrate 101 is slightly doped with p-type dopants, for example B. The concentration of B is approximately 1 to $2 \times 10^{16}$ cm$^{-3}$.

The substrate 101 contains the n-type doped buried well or layer 170. The buried well 170 has P or As as a dopant. In the present exemplary embodiment, a mask is patterned in order to define the buried well regions. Then n-type dopants are implanted into the buried well regions of the substrate 101. The buried well 170 serves to insulate a p-type well from the substrate 101 and furthermore forms a conducting bridge between the buried plates 165 of the trench capacitors 160. The concentration and energy of the implantation is approximately $>1 \times 10^{13}$ cm$^{-2}$ at approximately 1.5 MeV. Alternatively, the buried trench 170 is formed by implanting and subsequently growing an epitaxial silicon layer above the substrate surface.

A substructure stack 107 is formed on the surface of the substrate 101. The substructure stack 107 includes, for example, a substructure oxide layer 104 and a substructure stop layer 105. The substructure stop layer 105, which acts as a polish or etch stop for subsequent processes, preferably includes nitride. A hard mask layer (not illustrated), for example, is provided above the substructure stop layer 105. This hard mask layer includes, for example, TEOS (tetraethylene orthosilicate). Other materials, such as BSG (borosilicate glass), can also be used as the hard mask layer, in which case in addition an antireflection coating (ARC) (not illustrated) can be used in order to improve the lithographic resolution.

The hard mask layer is patterned using customary photolithographic techniques in order to define the region 102 in which a trench 108 is to be formed. These steps include the deposition of a photoresist layer and the selective exposure of the same with the desired pattern. The photoresist is subsequently developed and either the exposed or non-exposed regions are removed (positive or negative resist). The exposed regions of the substructure stack 107 are then etched as far as the surface of the substrate 101, in which case preferably reactive ion etching (RIE) forms the deep trench 108.

A polysilicon semiconductor layer 152 is then deposited over the wafer in order to fill in the trench 108. Amorphous silicon can also be used, as can further types of material which have a temperature stability up to approximately 1100° C. and can be removed selectively with respect to nitride or oxide. The polysilicon 152 is referred to as a sacrificial layer because it is removed later. Usually, a barrier layer 151 is previously formed as a natural oxide which covers the side walls of the trench before the trench 108 is filled with the polysilicon 152. The oxide layer or barrier layer 151 which is used as an etch stop layer is preferably 5 to 50 nm thick and can be formed by deposition or with a thermal step.

According to FIG. 4B, the polysilicon 152 is removed as far as a lower region of the trench 108 in a following method step. The removal of the polysilicon 152 includes, for example, the planarization through the use of chemical-mechanical polishing (CMP), chemical dry etching (CDE) or reactive ion etching (RIE) in order to form a co-planar surface with the upper side of the polysilicon in the trench 108 and at the upper side of the substructure stack 107. Reactive ion etching is then carried out in order to "countersink" the polysilicon 152 in the trench 108. It is also possible to use chemical dry etching to lower the polysilicon 152 in the trench 108. However, the polysilicon 152 is preferably planarized and countersunk by chemical dry etching (CDE) or reactive ion etching (RIE) in a single step. The countersunk or recessed distance is preferably approximately 0.5 to 2 μm from the substrate surface. If a thermal oxide (SiO$_2$) and/or a deposited oxide is used as the oxide layer or barrier layer 151, the barrier layer may be retained in the upper region of the trench 108.

A dielectric layer is then deposited over the entire wafer and covers the substructure stack 107 and the side walls of the trench. The dielectric layer is used here to form the insulating collar 168. The dielectric layer is composed, for example, of an oxide.

In the present exemplary embodiment, the dielectric layer is formed by growing a layer of thermal oxide and subsequently depositing an oxide layer through the use of chemical vapor phase deposition (CVD), for example plasma-enhanced CVD (PECVD) or low-pressure CVD (LPCVD), using TEOS. The CVD oxide can be compressed through the use of a tempering step. The oxide layer is sufficiently thick, to be precise 10 to 50 nm, to avoid a vertical leakage current. Alternatively, the dielectric layer can, however, also have a layer of thermal oxide.

However, the dielectric layer can alternatively also be formed from a CVD oxide. After the formation of the CVD oxide, a tempering step for compressing or compacting the oxide can also be carried out. The tempering step is carried out, for example, in an Ar, N$_2$, O$_2$, H$_2$O, N$_2$O, NO or NH$_2$ atmosphere. An oxidizing atmosphere, for example O$_2$ or H$_2$O, can be used to form a thermal oxide layer under the CVD oxide. Oxygen from the atmosphere then diffuses through the CVD oxide in order to form a thermal oxide layer on the substrate surface. This advantageously permits a thermal oxide to be formed, if desired without the requirement for a thermal oxidation step before the deposition of the CVD oxide. The tempering step is typically carried out at a temperature of approximately 1000 to 1100° C. and for approximately 0.5 to 3 hours.

The dielectric layer is then etched in accordance with FIG. 4B, for example through the use of reactive ion etching, in order to form the insulating collar 168. The chemicals for the reactive ion etching are selected such that the oxide is etched selectively with respect to the polysilicon 152 and the nitride. The reactive ion etching removes the dielectric layer from the surface of the substructure stack 107 and the base of the opening. The dielectric layer remains on the silicon side wall, as a result of which the insulating collar 168 is formed. As illustrated in FIG. 4B, the upper region of the insulating collar 168 is slightly eroded and forms a beveled upper section.

According to FIG. 4C, the polysilicon sacrificial layer 152 is then also removed in the lower region of the trench 108. The removal of the polysilicon sacrificial layer 152 is preferably carried out through the use of CDE. The thin natural oxide layer 151 (not illustrated in FIG. 4C) is then typically present on the exposed side walls of the trench. This thin natural oxide layer 151 can be sufficient to serve as a CDE etch stop. A CDE etching step, for example using $NF_3+Cl_2$ as chemicals, can etch silicon or polysilicon with a relatively high selectivity with respect to the oxide, which permits the polysilicon to be removed using the thin natural oxide layer 151 as etch stop. For example, a selectivity of approximately 4000:1 for the removal of the polysilicon from the trench 108 was determined using the natural oxide 151 as etch stop layer.

Alternatively, a CDE step with high $Cl_2$ content can be used to increase the selectivity of the silicon or polysilicon etching with respect to the oxide. A flow rate of approximately 12 sccm (standard cubic centimeters per minute) then results in an effective oxide etching rate of zero, while the polysilicon etching rate is in the order of magnitude of approximately 2 $\mu$m/min. This permits the natural oxide layer 151 to be used as an efficient etch stop for the removal of the sacrificial polysilicon layer. The thickness of the natural oxide 151 is typically approximately 0.5 to 1 nm.

In addition, wet etching, for example using KOH or $HF:HNO_3:CH_3COOH$, can also be used when removing the polysilicon. However, using KOH can lead to K contamination on the side wall of the trench, which can require an additional cleaning step. Reactive ion etching is also possible when removing the polysilicon because it acts anisotropically. Suitable chemicals for reactive ion etching in order to remove the polysilicon contain $SF_6/NF_3/HBr$. Other suitable chemicals which etch polysilicon selectively with respect to oxide or nitride are, for example, $NF_3/HBr$ or $CF_4/O_2$ or $CF_4/O_2/Cl_2$.

The selectivity of reactive ion etching of polysilicon with respect to oxide or nitride it somewhat less than 100:1 on planar surfaces, but it rises to more than approximately 2000:1 on vertical surfaces, specifically due to the preferably vertical direction of the movements of the ions during the reactive ion etching. Due to the high degree of selectivity of the polysilicon with respect to oxide or nitride on the vertical surfaces, only the upper region of the insulating collar 168 is eroded. However, this is not a problem because the insulating collar 168 is not eroded underneath the surface of the substrate 101.

After the polysilicon 152 is removed, the buried plate 165 is now formed with preferably n-type dopants, for example As or P, as a second capacitor electrode. In contrast to the conventional doping methods, low-pressure gas phase doping is now used according to the present invention, in which process the buried plate 165 is formed in a self-aligning fashion with respect to the insulating collar 168 and as a direct function of the shape of the lower region of the trench 108 at a pressure of approximately 66.7 to 200 Pascal (0.5 to 1.5 Torr) and a temperature of approximately 750° C. to 1050° C. using $PH_3$ or $AsH_3$ as the doping gas and $H_2$ or He as the carrier gas.

The process is preferably carried out for approximately 30 minutes in the same system or in a commercially available high-temperature reactor without specific modification after cleaning through the use of an $H_2$ "prebake" at approximately 950° C. and a pressure of approximately 1 Torr (133 Pascal). However, UHV (ultra high vacuum) vacuum curing can also be carried out in the same way in order to clean or smooth a surface. The actual low-pressure gas phase doping is now preferably carried out in the same system at a pressure of 66.7 to 200 Pascal (0.5 to 1.5 Torr) and a temperature of 750° C. to 1050° C., $AsH_3$ or $PH_3$ being used in a carrier gas composed of $H_2$ or He.

In contrast to conventional gas phase doping, with the low-pressure gas phase doping according to the invention there is no deformation or flowing of the silicon patterns, for which reason sufficiently small patterns can be used, in particular for future technology "shrinks." In addition, in contrast with the previous opinions and expectations of specialists in this field, it has surprisingly been found that the low-pressure gas phase doping according to the invention provides without difficulty the dopant concentrations which are necessary for the buried plate 165. It has also been found that the insulating collar 168 acts as a usable diffusion barrier during the low-pressure gas phase doping according to the invention, and the buried plate 165 is thus formed only in the actually desired, lower region of the trench 108. In particular when arsenic is used, such a high concentration of arsenic is obtained in the lower region of the trench 108 that the capacitance of the trench capacitor is reduced further due to a reduced spatial charge zone, and additional shrinks are thus made possible.

According to FIG. 4D, a storage dielectric layer 164, which covers the surface of the substructure stack 107 and the interior of the trench 108, is then deposited on the wafer. The storage dielectric layer 164 serves here as a storage dielectric for separating the capacitor plates or the buried plate 165 from a filler layer 161 which is subsequently inserted into the trench 108. In a preferred exemplary embodiment of the present invention, firstly prenitridization at approximately 950° C. and a pressure of approximately 6 Torr (800 Pascal) is carried out in the same low-pressure vertical oven (LPCVD). Then, again using the same system, a main nitridization is preferably carried out, in which process an approximately 3 to 6 nm thick silicon nitride ($Si_3N_4$) layer is formed in the trench 108 using dichlorosilane ($SiCl_2H_2$) or $SiH_4$ and $NH_3$ at a temperature of approximately 700° C. to 800° C. and a pressure of 26.6 Pascal to 46.7 Pascal (200 to 350 mTorr). Alternatively, a different storage dielectric, for example materials with a high dielectric constant (for example $TiO_2$, $WO_x$, . . . ), can be used for the storage dielectric layer 164, in which process a combination with suitable metal electrodes, (SIS, semiconductor insulating semiconductor; MIS, metal insulator semiconductor; MIM, metal insulator metal) is also possible.

Due to the integrated formation of the dielectric layer 164 and the buried plate 165 in the same system, a further considerable saving in process costs is achieved. In addition, a significant reduction in process costs, in particular in comparison with conventional gas phase doping, is obtained by virtue of the considerable saving in $AsH_3$ and/or $PH_3$. A further cost saving or simplification of the process is obtained in particular by virtue of the elimination of the high-temperature step such as is necessary, for example, for diffusing out dopants when ASG deposition is carried out.

As an alternative to the nitridization described above through the use of prenitridization and main nitridization in the same system or in the same low-pressure vertical oven, the dielectric layer 164 can also be formed in some other way. In particular, the formation of dielectric layers with a high relative dielectric constant (for example $Ta_2O_5$, $TiO_2$, WO$_x$, Al$_2$O$_3$, . . . ) is significant because this provides a further increase in the capacitance in the trench capacitor.

Subsequently, according to FIG. 4D, the further polysilicon layer 161 is deposited on the surface of the wafer in order to fill in the trench 108 and to cover the substructure stack 107, a CVD method being preferably used. Instead of the conductive polysilicon layer 161, it is, however, also possible to deposit any further electrically conductive layer in a conformal fashion, as a result of which the trench 108 is filled in. The doped polysilicon 161 serves here as a second capacitor electrode and can alternatively also be composed of amorphous silicon, which is doped, for example, in situ or sequentially.

Figure 4E:
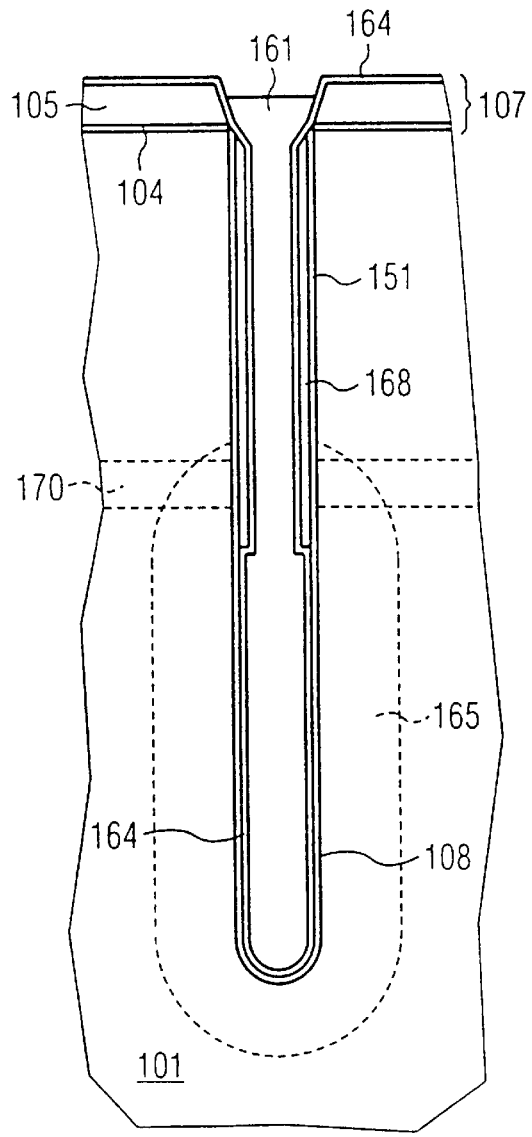

According to FIG. 4E, the conductive polysilicon layer 161 is subsequently lowered, for example through the use of a CDE step or through the use of a RIE step, using suitable chemicals such as NF$_3$/Cl$_2$ or NF$_3$/HBr or SF$_6$. This advantageously protects the substructure oxide 105 during the subsequent wet etching processes. The polysilicon layer 161 can, however, also be countersunk to the depth of the buried plate 165 if underetching does not constitute a problem.

Figure 4F:
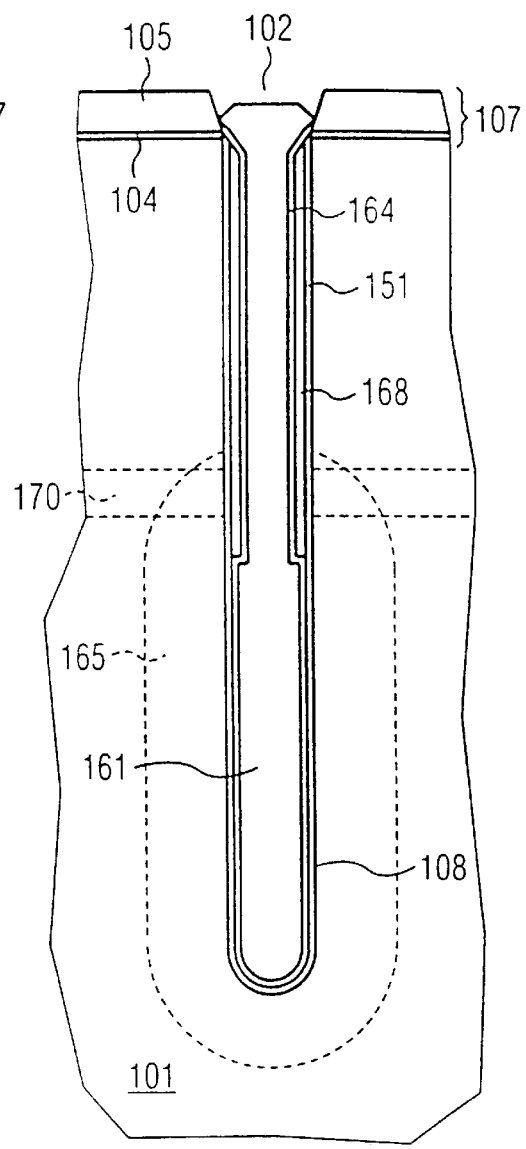

According to FIG. 4F, the remaining dielectric layer 164 above the polysilicon layer 161 is removed through the use of wet etching, DHF (diluted hydrofluoric acid) and HF/glycerol being preferably used. As an alternative to this, it is also possible to carry out a CDE step.

Figure 4G:
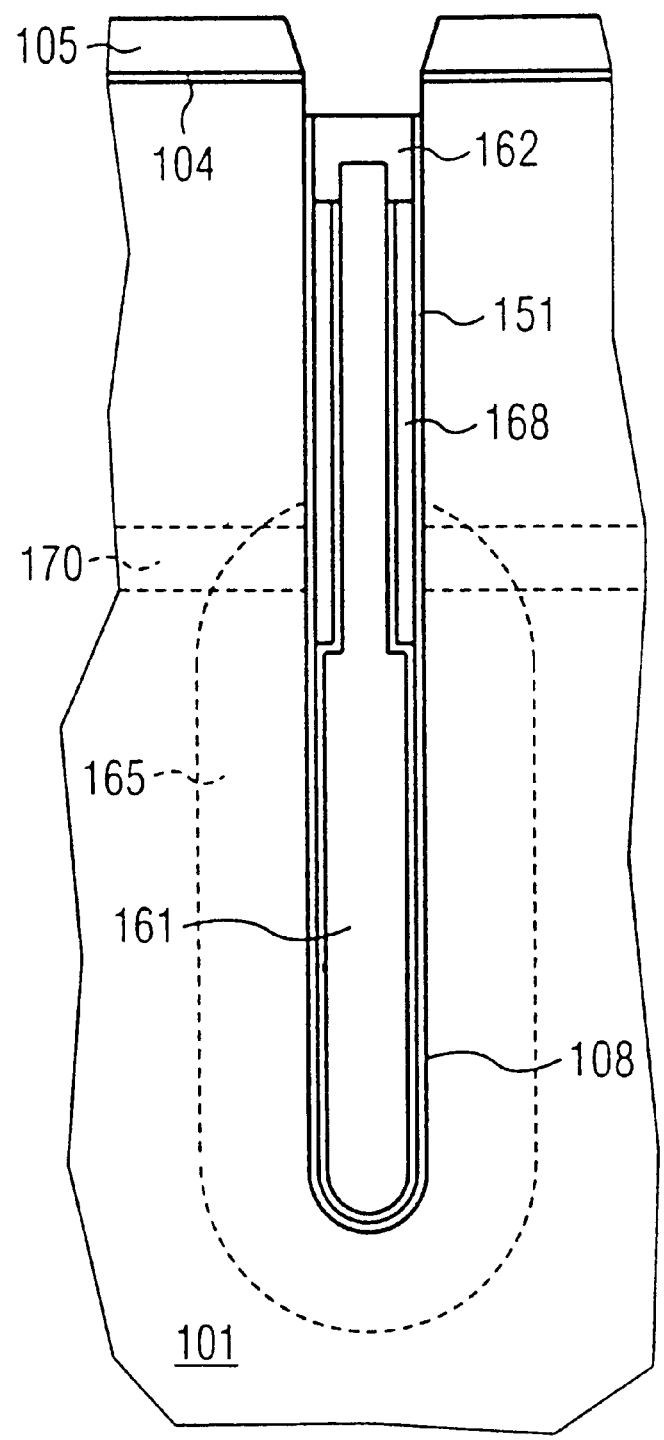

According to FIG. 4G, a buried bridge 162 is formed in a following method step. The buried bridge 162 is formed, for example, by etching in order to countersink the doped polysilicon 161 into the trench 108. To do this, reactive ion etching is generally used. The nonactive region of the cell is then defined through the use of a customary photolithographic technique and subsequently etched anisotropically, reactive ion etching being preferably used. The nonactive region here is the region in which the STI trench (see 180) is subsequently formed.

This provides a trench capacitor manufacturing method which permits, in particular, a buried plate to be formed in a particularly simple and cost-effective way. Problems with edge coverage, such as may occur, for example, with ASG deposition, are precluded here in all cases.

According to FIG. 3, a width or diameter of the lower region of the trench 108 may also be greater than the width or diameter of an upper region of the trench. Such an increase in the width improves the capacitance of the trench capacitor. The polysilicon sacrificial layer 152 described in FIG. 4B is, for example, removed through the use of CDE in order to obtain such a pattern, NF$_3$/Cl$_2$ being preferably used for this. Further chemicals can also be used for the selective etching of the silicon. In addition, reactive ion etching using SF$_6$, NF$_3$/HBr or wet etching using KOH can also be applied. The lower part of the trench 108 is widened here through the use of CDE etching, for example. The etching chemicals for the CDE etching are selected such that they also remove the thin natural oxide film 151 (not illustrated in FIG. 4B) on the side walls of the trench. This can be carried out by reducing the flow rate of Cl$_2$ in order to reduce the selectivity of the etching with respect to the oxide, or by changing the chemicals.

The wet etching or the CDE is controlled here in such a way that it completely removes the sacrificial polysilicon or the sacrificial layer 152 and restricts the widening such that it does not extend into adjacent trenches or make contact with them. The widening of the lower region of the trench 108 amounts to approximately 50% of the minimum distance between adjacent trenches, and is preferably less than 20 to 30% of the minimum distance between adjacent trenches. Because the distance between adjacent trenches is typically associated with the minimum dimension, the widening should be restricted to less than 50% of the minimum dimension or width of the pattern. This provides, for example, a trench with a bottle shape whose lower diameter is less than twice the minimum width of the pattern. The widening of the trench is preferably approximately 20 to 40% of the minimum dimension or width of the pattern.

After the sacrificial polysilicon 152 and the etch stop layer 151 are removed, the buried plate 165 is in turn formed with the low-pressure gas phase doping already described above. This process is therefore not described again in this context.

In this way, a widening of the trench 108 in its lower region is achieved, providing a trench capacitor with increased capacitance together with reduced manufacturing costs.

Figure 5:
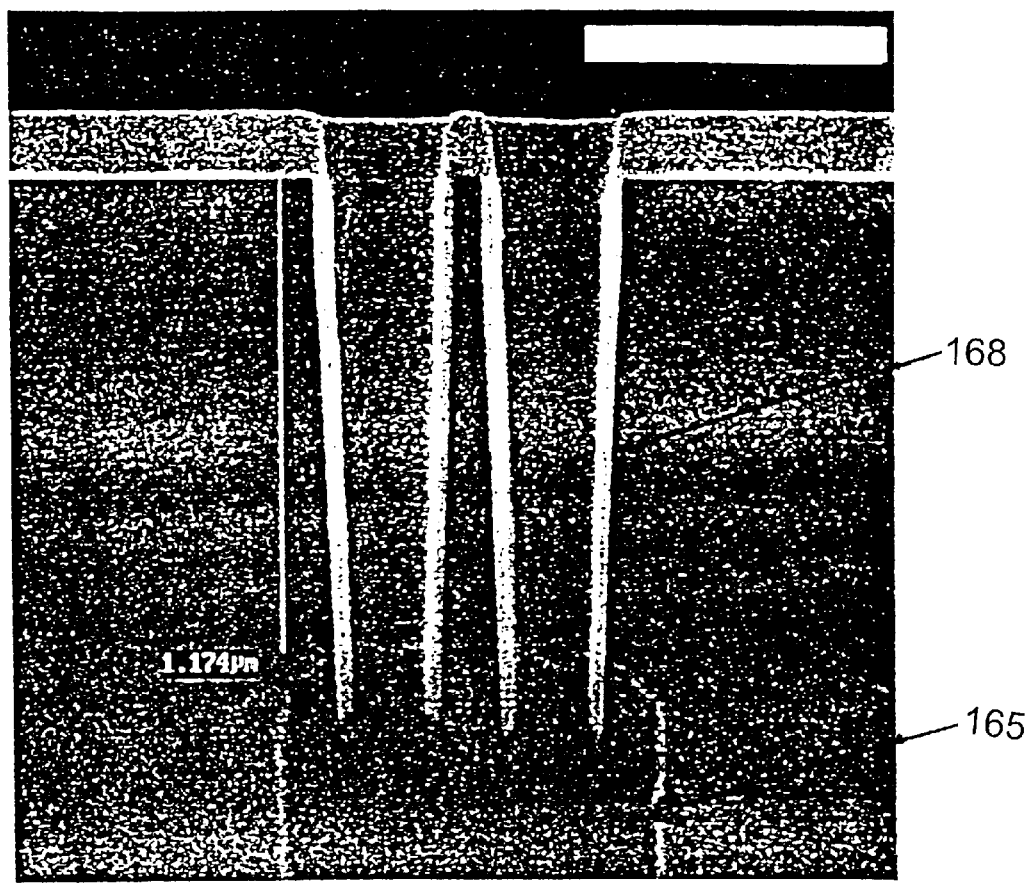
FIG. 5 is a photographic sectional view of an upper part of the trench capacitor according to the invention.

FIG. 5 shows a photographic representation of an upper part of the trench capacitor according to the invention, from which it is apparent that the insulating collars 168 act as excellent diffusion barriers when the low-pressure gas phase doping according to the invention is used. The diffusing out of dopants in order to form the buried plate 165 is consequently found only in lower regions of the trench.

The invention has been described in particular with reference to a DRAM semiconductor memory cell. However, it is not restricted to memory cells but rather covers all other integrated circuits in which a trench capacitor is to be formed with an increased capacitance, improved charging properties and with reduced manufacturing costs.

We claim:

1. A method for manufacturing a trench capacitor, the method which comprises:
   (a) providing a substrate;
   (b) forming a trench with a lower region and an upper region in the substrate;
   (c) filling the lower region of the trench with a first filler material;
   (d) forming an insulation collar in the upper region of the trench;
   (e) removing the first filler material from the lower region of the trench;
   (f) forming a buried plate as a first capacitor plate in the substrate such that the buried plate is disposed adjacent the lower region of the trench and using a pressure below 200 Pascal for a low-pressure gas phase doping for forming the buried plate;
   (g) forming a dielectric layer as a capacitor dielectric lining the lower region of the trench and an inner side of the insulation collar; and
   (h) filling the trench with a conductive second filler material as a second capacitor plate.

2. The method according to claim 1, which comprises forming the buried plate in step (f) by using a pressure between 66 Pascal and 200 Pascal for the low-pressure gas phase doping.

3. The method according to claim 1, which comprises forming the buried plate in step (f) at a temperature between 750° C. and 1050° C.

4. The method according to claim 1, which comprises forming the buried plate in step (f) by using a doping gas selected from the group consisting of AsH$_3$ and PH$_3$ and by using a carrier gas selected from the group consisting of H$_2$ and He.

5. The method according to claim 1, which comprises forming the dielectric layer in step (g) and forming the buried plate in step (f) at substantially identical pressures and substantially identical temperatures.

6. The method according to claim 1, which comprises forming the dielectric layer in step (g) and forming the buried plate in step (f) at a pressure between 66 Pascal and 200 Pascal and a temperature between 750° C. and 1050° C.

7. The method according to claim 1, which comprises forming the dielectric layer by using a prenitridization step and a main nitridization step.

8. The method according to claim 7, which comprises carrying out the prenitridization step at a temperature of substantially 950° C. and a pressure of substantially 800 Pascal and by using $NH_3$ for the prenitridization step.

9. The method according to claim 7, which comprises carrying out the main nitridization step at a temperature of substantially between 700° C. and 800° C. and a pressure between 26.6 Pascal and 46.7 Pascal and by using $NH_3$ together with a compound selected from the group consisting of $SiCl_2H_2$ and $SiH_4$ for the main nitridization step.

10. The method according to claim 1, which comprises forming the buried plate self-aligned with respect to the insulating collar.

11. The method according to claim 1, which comprises forming, from a third, conductive filler material, a bridge above the insulating collar on the conductive, second filler material for forming a buried contact to the substrate.

12. The method according to claim 1, which comprises forming an etch stop layer on walls of the trench such that the etch stop layer is disposed under the first filler material.

13. The method according to claim 1, which comprises widening the lower region of the trench with respect to the upper region of the trench for forming a bottle shaped trench.

14. A method for manufacturing a trench capacitor, the method which comprises:

(a) providing a substrate;

(b) forming a trench with a lower region and an upper region in the substrate;

(c) filling the lower region of the trench with a first filler material;

(d) forming an insulation collar in the upper region of the trench;

(e) removing the first filler material from the lower region of the trench;

(f) forming a buried plate as a first capacitor plate in the substrate such that the buried plate is disposed adjacent to the lower region of the trench and using a gas phase doping at a pressure below 200 Pascal for forming the buried plate;

(g) forming a dielectric layer as a capacitor dielectric lining the lower region of the trench and an inner side of the insulation collar; and (h) filling the trench with a conductive second filler material as a second capacitor plate.

* * * * *